(12) United States Patent
Sinha et al.

(10) Patent No.: US 9,165,773 B2
(45) Date of Patent: Oct. 20, 2015

(54) ALUMINUM DOPANT COMPOSITIONS, DELIVERY PACKAGE AND METHOD OF USE

(71) Applicants: Ashwini K. Sinha, East Amherst, NY (US); Lloyd A. Brown, East Amherst, NY (US)

(72) Inventors: Ashwini K. Sinha, East Amherst, NY (US); Lloyd A. Brown, East Amherst, NY (US)

(73) Assignee: PRAXAIR TECHNOLOGY, INC., Danbury, CT (US)

( * ) Notice: Subject to any disclaimer, the term of this patent is extended or adjusted under 35 U.S.C. 154(b) by 18 days.

(21) Appl. No.: 14/287,840

(22) Filed: May 27, 2014

(65) Prior Publication Data
US 2014/0357069 A1 Dec. 4, 2014

Related U.S. Application Data

(60) Provisional application No. 61/827,934, filed on May 28, 2013.

(51) Int. Cl.
| H01L 21/265 | (2006.01) |
|---|---|
| H01L 21/67 | (2006.01) |
| H01J 37/08 | (2006.01) |
| H01J 37/317 | (2006.01) |

(52) U.S. Cl.
CPC ............ *H01L 21/265* (2013.01); *H01J 37/08* (2013.01); *H01J 37/3171* (2013.01); *H01L 21/67017* (2013.01); *H01J 2237/006* (2013.01); *Y10T 137/86348* (2015.04); *Y10T 137/88054* (2015.04)

(58) Field of Classification Search
None
See application file for complete search history.

(56) References Cited

U.S. PATENT DOCUMENTS

| 5,937,895 | A | 8/1999 | LeFebre et al. | |
|---|---|---|---|---|
| 6,007,609 | A | 12/1999 | Semerdjian et al. | |
| 6,045,115 | A | 4/2000 | Martin, Jr. et al. | |
| 7,013,916 | B1 * | 3/2006 | Pearlstein et al. | 137/613 |
| 7,708,028 | B2 | 5/2010 | Brown et al. | |
| 7,905,247 | B2 | 3/2011 | Campeau | |
| 8,367,531 | B1 | 2/2013 | Omarjee et al. | |
| 2007/0256627 | A1 | 11/2007 | Kim et al. | |
| 2008/0135104 | A1 * | 6/2008 | Cooper et al. | 137/220 |
| 2008/0149176 | A1 * | 6/2008 | Sager et al. | 136/262 |
| 2008/0241575 | A1 | 10/2008 | Lavoie et al. | |
| 2009/0190908 | A1 | 7/2009 | Shibagaki | |
| 2012/0003819 | A1 | 1/2012 | Francis et al. | |

OTHER PUBLICATIONS

Amemiya, Kensuke et al. "High Energy Aluminum Ion Implantation Using a Variable Energy Radio Frequency Quadrupole Implanter," J. Vac. Sci. Tech. A 16(2), Mar./Apr. 1998, pp. 472-476.
Technical Bulletin AL-136: The Aldrich Sure/Pac™ Cylinder System. Apr. 1, 1997, pp. 1-2 XP055138312. Retrieved from the Internet: URL:https://www.sigmaaldrich.com/content/dam/sigma-aldrich/docs/Aldrich/Bulletin/al_techbull_all36.pdf.
"Dimethylaluminium Chloride 97%—Sigma-Aldrich". Sep. 4, 2014, pp. 1-1, XP055138318, Retrieved from the Internet. URL: http://www.sigmaaldrich.com/catalog/product/aldrich/256897?lang-de®ion-DE.

* cited by examiner

*Primary Examiner* — Khaja Ahmad
(74) *Attorney, Agent, or Firm* — Nilay S. Dalal

(57) ABSTRACT

A novel method and system for using aluminum dopant compositions is provided. A composition of the aluminum dopant compositions is selected with sufficient vapor pressure and minimal carbon content, thereby enabling ease of delivery to an ion implant process and substantial reduction of carbon deposition during Al ion implantation. The source material is preferably stored and delivered from a sub-atmospheric storage and delivery device to enhance safety and reliability during the Al ion implantation process.

17 Claims, 4 Drawing Sheets

Schematic of beamline ion implant system

Schematic of beamline ion implant system

Schematic of plasma immersion ion implant system

ALUMINUM DOPANT COMPOSITIONS, DELIVERY PACKAGE AND METHOD OF USE

The present application claims priority from provisional U.S. Application Ser. No. 61/827,934, filed May 28, 2013, which is incorporated by reference herein in its entirety.

FIELD OF THE INVENTION

The present invention relates to novel aluminum dopant compositions and delivery packages for ion implantation and methods of using the aluminum dopant compositions.

BACKGROUND OF THE INVENTION

Ion implantation is an important process in semiconductor/microelectronic manufacturing. The ion implantation process is used in integrated circuit fabrication to introduce dopant impurities into semiconductor wafers. Generally speaking, with respect to semiconductor applications, ion implantation involves the introduction of ions from a dopant species, also commonly referred to as dopant impurities, into a semiconductor substrate material in order to change the substrate material's physical, chemical and/or electrical characteristics. The desired dopant impurities are introduced into semiconductor wafers to form doped regions at a desired depth. The dopant impurities are selected to bond with the semiconductor wafer material to create electrical carriers and thereby alter the electrical conductivity of the semiconductor wafer material. The concentration of dopant impurities introduced determines the electrical conductivity of the doped region. Many impurity regions are necessarily created to form transistor structures, isolation structures and other electronic structures, which collectively function as a semiconductor device.

An ion source is used to generate a well-defined ion beam of ion species from the dopant species. The ion source is a critical component of the ion implantation system, which serves to ionize dopant species that are to be implanted during the implantation process. The dopant ions are generally derived from a source dopant species. The ion-source generates a defined ion beam for a variety of ion species derived from a source dopant gas. The ion source can be a filament or cathode made of tungsten (W) or tungsten alloy. Current is applied to the filament to ionize the source dopant species within an ion implanter. The source dopant species dissociates into corresponding ionic species, which is thereafter implanted into a given substrate.

Current semiconductor device technology utilizes a variety of dopant species. Aluminum (Al) ion implantation is gaining interest in integrated circuit (IC) manufacturing for several applications such as reducing the contact resistance for PMOS devices, tuning work function of metal gates and reducing electro-migration in Cu interconnects. As reported in Kensuke et al. (JVST-A 16(2), 1998) and Rao et al. (Proceedings of $19^{th}$ International conference on Ion implantation Technology, 2012), AlCl3 is typical dopant source that is utilized for implantation of Al ions. However, process challenges currently exist for effective implantation of Al ions from AlCl3. For example, AlCl3 is a solid under ambient conditions which therefore requires heating to a temperature higher than 200° C. to generate sufficient flux necessary to perform the implant process. Additionally, all of the flow lines from the source gas to the ion source chamber must be heat traced to avoid condensation of AlCl3 therealong. These are examples of the types of challenges in supplying $AlCl_3$ that do not make it a suitable Al implant source gas As an alternative to aluminum dopant sources which are solids at ambient temperature, Omarjee et al. (U.S. Pat. No. 8,367,531) describes the use of aluminum source compounds which are liquid at ambient temperature. Omarjee et al. presents Trimethylamine-Alane (TMAA), triethylamine-Alane (TEAA), Dimethylethylamine-Alane (DMEAA), mythyl-pyrollidone-Alane (MPA) and trimethylamine-Alane-borohydrate (TMAAB) as suitable Al dopant source compounds. However, the vapor pressure of each of these molecules is unacceptably low such that the molecules cannot be transported to the ion implant chamber without any external heating. TMAA has the highest vapor pressure (2 torr) at the room temperature from the list above. The flow control device requires greater than 10 torr of upstream pressure to maintain the desired flow rate for such processes. In addition, all of the above mentioned molecules contain excessive amounts of carbon in its structure. The use of the above molecules can lead to unacceptable carbon deposition inside the ion source or plasma chamber. Such deposits can interfere with proper functioning of the ion source or plasma chamber and ultimately can lead to their pre-mature failure.

Shibagaki (US Patent Pub. No. 20090190908) suggests the use of Trimethyl-Aluminum (TMA) for Al implantation. TMA is liquid at room temperature and therefore can be conveniently transported to the ion source or plasma chamber of an ion implant system. However, similar to the molecules described in Omarjee et al, TMA is pyrophoric, and hence there is a need to develop a safe packaging and delivery method to handle TMA. In addition, TMA also contains high amount of C in its structure such that excessive carbon deposition in the ion source chamber can cause issues arising therefrom, such as premature of the ion source.

Accordingly, there is an unmet need for an Al containing molecule and associated delivery package that can be used to deliver Al containing gas to the ion implantation system in a safe and convenient manner.

SUMMARY OF THE INVENTION

The invention may include any of the following aspects in various combinations and may also include any other aspect described below in the written description or in the attached drawings.

The invention relates, in part, to a method and system for using aluminum dopant compositions. The compositions of the aluminum dopant gases utilized herein have been found to improve ease of delivery to an ion implant process and substantially reduce accumulation of carbon deposits within the ion chamber.

In a first aspect, a method for storing and delivering aluminum-containing dopant material, comprising: selecting the aluminum-containing dopant material represented by the formula $Al_xR_yL_z$, where R is a methyl group, L is a halogen selected from the group consisting of Cl, F, I and Br and x can be either 1 or 2, whereby if x=1, then y=1 or 2 and if x=2 then y=2-4, and z=3x−y; storing the aluminum-containing dopant material in a storage and delivery container, said material being chemically stable therein; withdrawing the material in a vapor phase from the storage and delivery container; flowing the vaporized material at a predetermined flow rate in the absence of heat traced lines extending between said container and said chamber; and introducing said vaporized material to an ion source chamber.

In a second aspect, a sub-atmospheric storage and delivery package for a dopant gas composition comprising: aluminum-containing dopant material represented by the formula $Al_xR_yL_z$, where R is a methyl group, L is a halogen selected from the group consisting of Cl, F, I and Br and x can be either 1 or 2, whereby if x=1, then y=1 or 2 and if x=2 then y=2-4; and z=3x−y; and a cylinder for holding the aluminum-containing dopant material in at least partial vapor phase under sub-atmospheric conditions, said vapor pressure greater than about 2 Torr; and a dual port valve assembly in mechanical communication with the cylinder, the dual port valve comprising a fill port valve and a discharge port valve, wherein the fill port valve is in fluid communication with an interior of the cylinder to introduce the aluminum-containing dopant material therein, and the discharge port valve is in fluid communication with a flow discharge path extending from the interior to the exterior of the cylinder to discharge the aluminum-containing dopant material therefrom; and a check valve located along said flow discharge path, said check valve configured to move from a closed position to an open position in response to a sub-atmospheric condition external to the cylinder.

In a third aspect, a composition for implanting aluminum ions, comprising: aluminum-containing dopant material represented by the formula $Al_xR_yL_z$, where R is a methyl group, L is a halogen selected from the group consisting of Cl, F, I and Br and x can be either 1 or 2, whereby if x=1, then y=1 or 2 and if x=2 then y=2-4, and z=3x−y for x=1 or x=2; wherein said aluminum-containing dopant material is adapted to produce aluminum ions to be deposited into a substrate with a substantial reduction in carbon deposition in comparison to conventional aluminum-containing dopant compositions.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein.

DETAILED DESCRIPTION OF THE INVENTION

Figure 1:
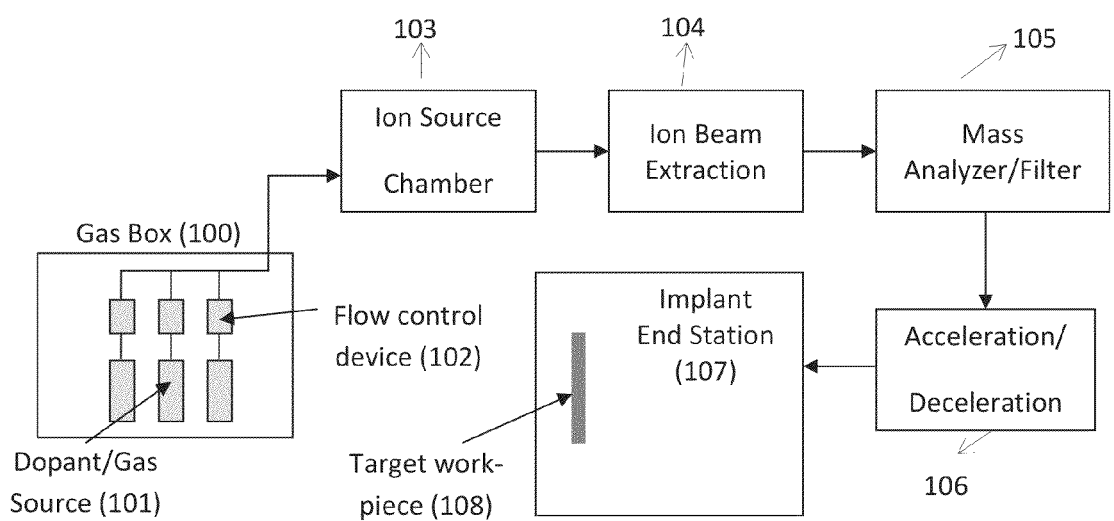
FIG. 1 shows a beamline ion implant system, incorporating the principles of the invention.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

The invention may include any of the following embodiments in various combinations and may also include any other aspect described below in the written description or in the attached drawings.

As used herein, unless indicated otherwise, all concentrations are expressed as volumetric percentages ("vol %"). The present invention relates to composition of Al dopant material for their use in Al implantation and to a method of their safe packaging, handling and delivery to an ion implant chamber. The composition of Al dopant material is represented by the formula $Al_xR_yL_z$, where R is a single carbon alkyl group such as, by way of example, (CH3); L is an halogen such as, by way of example, Cl, F, I or Br; x can be either 1 or 2, whereby if x=1 then y=1 or 2, and if x=2 then y=2-4. For either value of x, z=3x−y.

Numerous exemplary Al dopant materials defined by $Al_xR_yL_z$ may be selected for ion implantation. In one embodiment, the Al dopant material is Dimethyl Aluminum Chloride (DMAC) having the formula $Al(CH_3)_2Cl$. DMAC is a liquid at room temperature having a vapor pressure of 16 torr at 25° C. DMAC has a relatively higher vapor pressure in comparison to other conventional Al dopant material, thereby enabling its transport as a vapor to an ion source or plasma chamber without external heating. Additionally, the vapor pressure of the Al dopant compositions of the present invention are adequate to prevent the vapor from liquefying as the Al dopant materials are transported along lines or conduits into the ion chamber.

In another embodiment, the Al dopant material is Methyl Aluminum Dichloride (MADC) having the formula $Al(CH_3)Cl_2$. In yet another embodiment, the Al dopant material is Methyl Aluminum SesquiChloride (MASC) having the formula $Al_2(CH_3)_3Cl_3$.

Other aluminum-containing dopant compositions in accordance with the present invention may be selected from the group consisting of (Al(CH3)2Cl); (Al(CH3)Cl2); (Al2(CH3)3Cl3); $Al(CH_3)_2Cl$; $Al(CH_3)_2Cl2$; $Al_2(CH_3)_3Cl_3$; $Al(CH_3)_2F$; Al(CH3)F2; Al(CH3)Br2; and $Al(CH_3)_2Br$.

In addition to the Al dopant materials of the present invention having appreciable vapor pressure, the amount of carbon present in each of the structures is limited to a single alkyl group as defined by $R_y$. Reduction in the amount of carbon in the Al dopant material may minimize the amount of carbon-based deposits that can accumulate onto ion chamber components. Furthermore, halides as designated herein by Lz may impart a process benefit. In particular, halide ions and neutrals present in the plasma may facilitate the reduction of carbon deposition. Without being bound by any particular theory, ionization of the Al dopant gas material causes the halide to be released as either anions, cations, radicals or combinations thereof, which can then react in-situ by etching various deposits, including carbon-based deposits that may have accumulated onto surfaces of the ion chamber components. Additionally, the halide ions and radicals can simultaneously recombine with carbon ions and carbon radicals present in the gas phase and formed from ionization of the Al dopant gas composition, thereby preventing pre-mature failure of the ion-source and the plasma chamber. Accordingly, the combination of a single alkyl group with a halide in the Al dopant molecule may be synergistically reducing the accumulation of carbon deposits during the ion implantation process in comparison to Al dopant molecules not having a halogen and/or having more than a single carbon alkyl group. The net result is a significant reduction of carbon-based deposits along surfaces of the ion source apparatus.

With reference to FIG. 1, an exemplary beam line ion implantation apparatus 100 in accordance with the principles of the invention is shown. Beam line ion-implant systems are used to perform ion implant processes. The components of a beam line ion plant system are described in FIG. 1. A dopant source material 101 is selected in accordance with the present invention so as to have adequate vapor pressure and minimal carbon. The Al dopant source material 101 is preferably in a gas or vapor phase having the representative formula $Al_xR_yL_z$ where R is a single carbon alkyl group (i.e., CH3); L is an halogen such as Cl, F, I or Br; x can be either 1 or 2, whereby if x=1 then y=1 or 2, and if x=2 then y=2-4. For either value of x, z=3x−y. The vapor pressure of the material 101 is sufficient to eliminate heating the lines between the gas box 100 and the ion source chamber 103. The material 101 is introduced into an ion source chamber 103 where the ionization of the material 101 occurs. Energy is introduced into the chamber 103 to ionize the gas 101. Flow control device 102, which can include one or more mass flow controllers and corresponding valves, is used to control the flow rate of gas at a predetermined value. The ionization of the dopant precursor material creates various aluminum ions. An ion extraction system 104 is used to extract the aluminum ions from the ion source chamber 103 in the form of an ion beam of desired energy. Extraction can be carried out by applying a high voltage across extraction electrodes. The beam is transported through a mass analyzer/filter 105 to select the species to be implanted. The ion beam can then be accelerated/decelerated 106 and transported to the surface of a target workpiece 108 positioned in an end station 107 for implantation of the dopant element into the workpiece 108. The workpiece may be, for example, a semiconductor wafer or similar target object requiring ion implantation. The Al ions of the beam collide with and penetrate into the surface of the workpiece to form a doped region with the desired electrical and physical properties.

Figure 2:
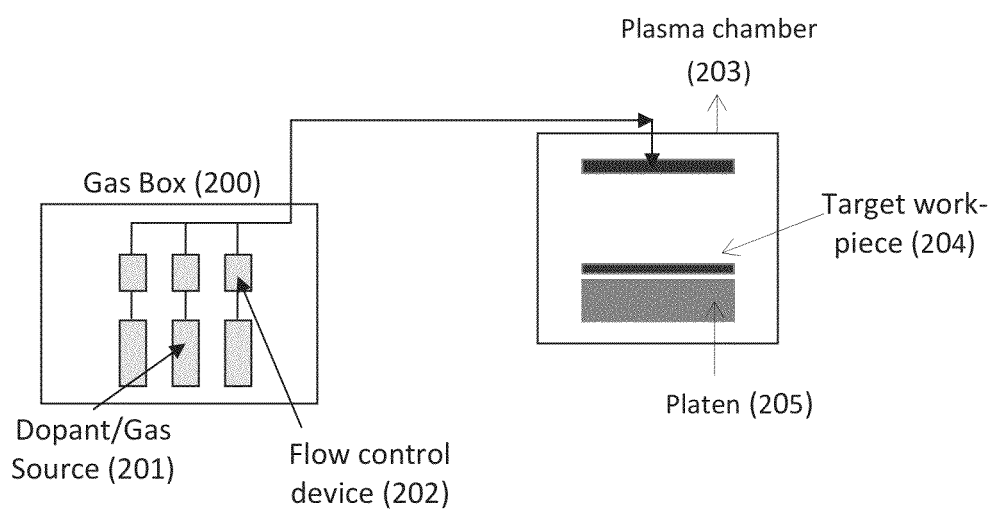
FIG. 2 shows a plasma immersion ion implant system, incorporating the principles of the invention.

It should be understood that the novel Al dopant compositions of the present invention can be utilized with other ion implant systems. For example, a Plasma immersion ion implant (PIII) system as shown in FIG. 2 may also be utilized to implant Al ions. Such a system includes a gas box 200, which is similar in configuration to the beam line ion implantation apparatus 100. Operation of the PIII system is similar to that of the beam line ion implant system of FIG. 1. Referring to FIG. 2, the Al dopant gases of the present invention is defined by the representative formula $Al_xR_yL_z$ and introduced from the gas source 201 into the plasma chamber 203 by a flow control device 202. In accordance with the principles of the present invention, $Al_xR_yL_zR$ has a single carbon alkyl group (i.e., $R=CH3$); L is a halogen such as Cl, F, I or Br; x can be either 1 or 2, whereby if x=1 then y=1 or 2, and if x=2 then y=2-4. For either value of x, z =3x-y. Energy is subsequently provided to ionize the Al ionic species. The Al ions present in the plasma are accelerated towards the target work piece 204.

The flow rate for the inventive Al dopant materials disclosed above may vary from about 0.1 sccm to about 10 sccm for beamline ion implantation systems, and from about 1 sccm to 50 sccm for a PIII system.

The present invention additionally contemplates flowing inert gases such as nitrogen, helium, argon, krypton and xenon. Alternatively, non-inert gases such as fluorine containing gases, chlorine containing gases and hydrogen containing gases and their combinations thereof with the Al dopant materials disclosed above may be utilized. Any ratio of the Al dopant material and inert or non-inert gas is contemplated. The presence of an inert and/or non-inert gas may stabilize the operation of the ion-source and may also boost Al ion (Al+) beam current. In a preferred embodiment, fluorine or hydrogen containing gas may help in-situ removal of deposits formed during Al implant process.

Figure 3:
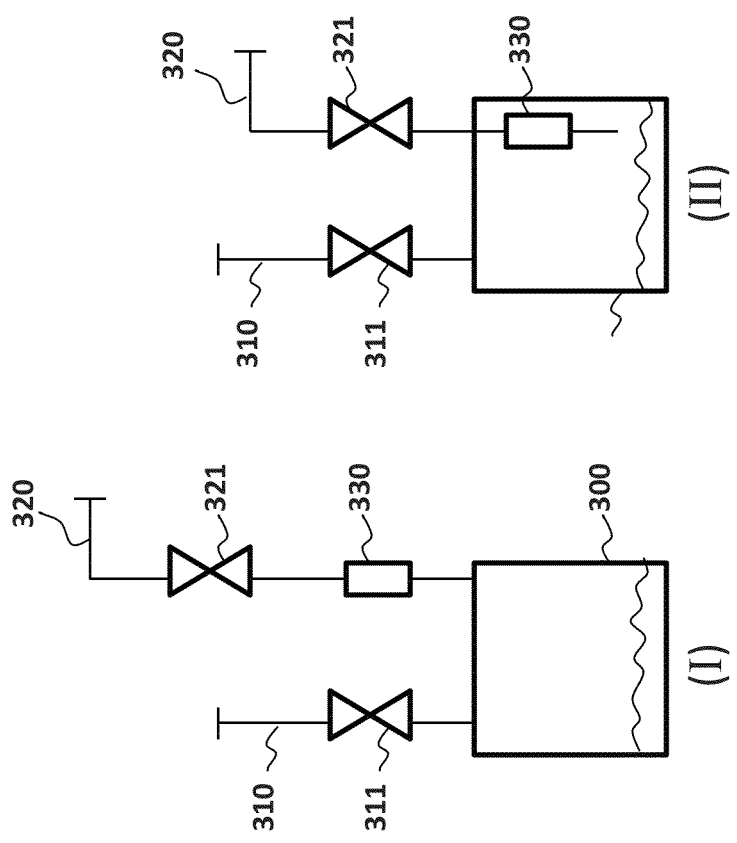
FIG. 3 and FIG. 4 show an exemplary storage and delivery packages, incorporating the principles of the present invention.
Figure 4:
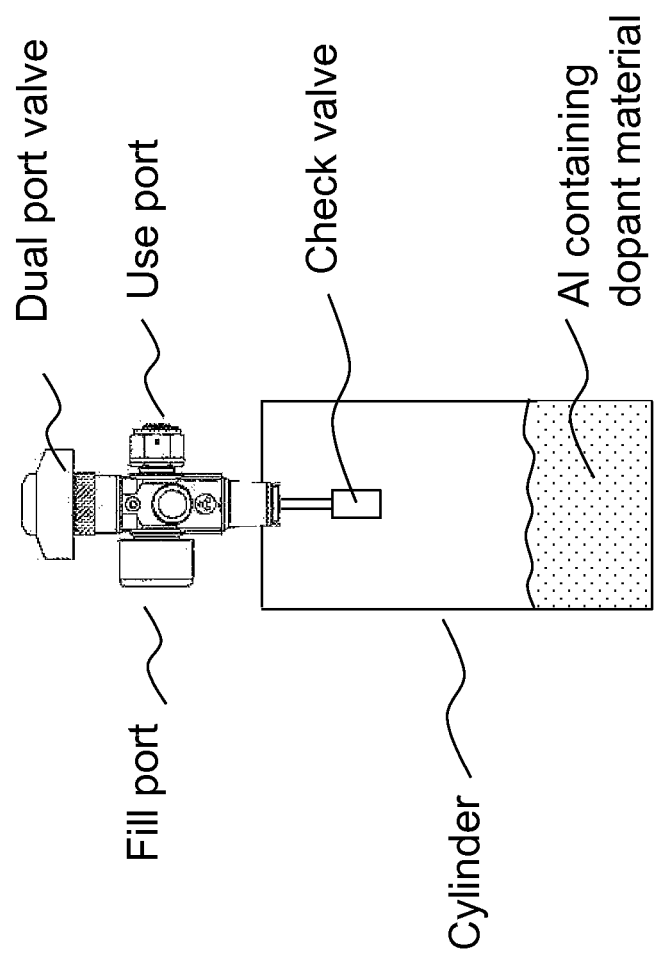

In another aspect of the present invention, a storage and delivery package for the Al dopant gas compositions disclosed herein is provided as shown in FIG. 3. The storage and delivery package allows for safe packaging and delivery of the inventive Al dopant materials. The embodiments of the storage and delivery package are described in FIG. 3. The Al dopant compositions of the present invention are contained within a container 300. The container 300 is equipped with an inlet port 310 to allow filling of container 300 with the desired Al dopant material. This port can also be used to purge the interior of container 300 with inert gas and evacuate container 300 before filling with the desired Al dopant material. An outlet port 320 is provided to withdraw the material out of container 300. A vacuum actuated check valve 330 is provided upstream of outlet port that dispenses a controlled flow rate of the Al dopant material in response to sub-atmospheric conditions occurring downstream of the cylinder 300. This vacuum actuated check valve 330 enhances the safety while handling the various Al dopant compositions of the present invention. When the user opens valve 321 to atmospheric, check valve 330 prevents introduction of any air or other contaminant inside container 300, and hence mitigates the risk of fire while using the pyrophoric Al dopant materials of the present invention. In this manner, high purity levels of the Al dopant compositions can be maintained during storage, delivery and use thereof in a safe manner. The check valve 330 can be situated either outside container 300 (Case I). Alternatively, the check valve 330 can be situated inside container 300 (Case II). The container 300 is in fluid communication with a discharge flow path, wherein said check valve 330 is actuated to allow a controlled flow of the Al dopant containing gas source material from the interior volume of the container 300 in response to a sub-atmospheric condition achieved along the discharge flow path.

The container 300 may be a cylinder for holding the aluminum-containing dopant material in at least partial vapor phase under sub-atmospheric conditions. The aluminum-containing dopant material is stored at sub-atmospheric conditions therewithin. The material remains chemically stable and does not undergo decomposition within the interior of the cylinder 300. The material is preferably stored as a liquid at ambient temperature (20-25° C.) and possesses sufficient vapor pressure such that thermal energy need not be added to the container 300, or during its transport from the container 300 to the ion chamber. In one embodiment, the vapor pressure is greater than 2 torr. In another embodiment, the vapor pressure is greater than 3 torr, and more preferably greater than 5 torr.

The cylinder 300 preferably includes a dual port valve assembly in mechanical communication with the cylinder 300. The dual port valve comprises a fill port valve and a discharge port valve, wherein the fill port valve is in fluid communication with an interior of the cylinder to introduce the aluminum-containing dopant material therein. The discharge port valve is in fluid communication with a flow discharge path extending from the interior to the exterior of the cylinder to discharge the aluminum-containing dopant material therefrom. The check valve 330 is located along said flow discharge path, whereby the check valve is configured to move from a closed position to an open position in response to a sub-atmospheric condition external to the cylinder.

In a preferred embodiment, the Uptime® delivery device, sold by Praxair® (Danbury, Conn.) and as disclosed in U.S. Pat. Nos. 5,937,895; 6,045,115; 6,007,609; 7,708,028; and 7,905,247, all of which are incorporated herein by reference in their entirety, may be employed in the present invention to safely deliver a controlled flow rate of the Al dopant gas composition from container 300 to an ion apparatus for Al ion implantation. Other suitable sub-atmospheric delivery devices may include pressure regulators, check valves, excess flow valves and restrictive flow orifices in various arrangements. For example, two pressure regulators may be disposed in series within the cylinder to down regulate the cylinder pressure of the Al dopant material containing gas source material to a predetermined pressure acceptable for downstream mass flow controllers contained along the fluid discharge line.

The container or cylinder 300 may be configured in combination with a beamline ion implant system (FIG. 1), whereby the container or cylinder 300 is operably connected to said system by a network of flow lines or conduit extending therebetween. Advantageously, the conduit is characterized by an absence of heat tracing.

Alternatively, the container or cylinder 300 may be configured in combination with a plasma immersion system (FIG. 2), whereby the container or cylinder 300 is operably connected to said plasma immersion system by a network of flow lines or conduit extending therebetween. Advantageously, the conduit is characterized by an absence of heat tracing.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A sub-atmospheric storage and delivery package for a dopant gas composition comprising:
    aluminum-containing dopant material represented by the formula $Al_xR_yL_z$, where R is a methyl group, L is a halogen selected from the group consisting of Cl, F, I and Br and x can be either 1 or 2, whereby if x=1, then y=1 or 2 and if x =2 then y=2-4; and z=3x−y; and
    a cylinder for holding the aluminum-containing dopant material in at least partial vapor phase under sub-atmospheric conditions, said vapor pressure greater than 2 Torr; and
    a dual port valve assembly in mechanical communication with the cylinder, the dual port valve comprising a fill port valve and a discharge port valve, wherein the fill port valve is in fluid communication with an interior of the cylinder to introduce the aluminum-containing dopant material therein, and the discharge port valve is in fluid communication with a flow discharge path extending from the interior to the exterior of the cylinder to discharge the aluminum-containing dopant material therefrom; and
    a check valve located along said flow discharge path, said check valve configured to move from a closed position to an open position in response to a sub-atmospheric condition external to the cylinder.

2. The sub-atmospheric storage and delivery package of claim 1, wherein a vacuum-actuated valve element is disposed along the flow discharge path, said delivery device actuated to allow a controlled flow of the aluminum-containing dopant material from the interior volume of the device in response to the sub-atmospheric condition achieved along the discharge flow path.

3. The sub-atmospheric storage and delivery package of claim 1, wherein the aluminum-containing dopant material is selected from the group consisting of (Al(CH3)2Cl), (Al(CH3)Cl2), (Al2(CH3)3Cl3) $Al(CH_3)_2Cl$, $Al(CH_3)Cl2$, $Al_2(CH_3)_3Cl_3$, $Al(CH_3)_2F$, $Al(CH_3)F2$, $Al(CH_3)Br2$ and $Al(CH_3)_2Br$.

4. The sub-atmospheric storage and delivery package of claim 1 in combination with a beamline ion implant system, said delivery package being operably connected to said system by conduit extending therebetween, wherein said conduit is characterized by an absence of heat tracing.

5. The sub-atmospheric storage and delivery package of claim 1 in combination with a plasma immersion ion implant system, said delivery package being operably connected to said system by conduit extending therebetween, wherein said conduit is characterized by an absence of heat tracing.

6. The sub-atmospheric storage and delivery package of claim 1, wherein said check valve disposed within the interior of the cylinder.

7. The sub-atmospheric storage and delivery package of claim 1, wherein said check valve is disposed within the exterior of the cylinder.

8. The sub-atmospheric storage and delivery package of claim 4, wherein said aluminum-containing dopant material is held in the cylinder as a liquid at 20-25° C. having a vapor pressure greater than 2 torr.

9. The sub-atmospheric storage and delivery package of claim 1, wherein said aluminum-containing dopant material is adapted to produce aluminum ions to be deposited into a substrate with a substantial reduction in carbon deposition in comparison to conventional aluminum-containing dopant compositions.

10. The sub-atmospheric storage and delivery package of claim 1, where said composition further comprises an inert gas, non-inert gas or any combination thereof, and whereby R contains two or more methyl groups.

11. The sub-atmospheric storage and delivery package of claim 1, wherein said aluminum-containing dopant material is stored at the sub-atmospheric conditions below 760 Torr.

12. The sub-atmospheric storage and delivery package of claim 1, wherein the aluminum-containing dopant material in the package is configured to be stored and withdrawn without the addition of thermal energy.

13. The sub-atmospheric storage and delivery package of claim 1, further comprising a diluents gas package in combination with sub-atmospheric storage and delivery package.

14. The sub-atmospheric storage and delivery package of claim 1, wherein said delivery package is configured to dispense said aluminum-containing dopant material at a flow rate is between 0.1-50 sccm.

15. The sub-atmospheric storage and delivery package of claim 1, wherein said delivery package is in flow communication with an ionization chamber.

16. The sub-atmospheric storage and delivery package of claim 15, wherein said delivery package is configured to withdraw said aluminum-containing dopant material from the package in response to a pressure in the ionization chamber being 760 torr or less.

17. The sub-atmospheric storage and delivery package of claim 1, wherein said aluminum-containing dopant material is stored as a liquid at 20-25° C. having a vapor pressure greater than 2 torr.

* * * * *